United States Patent
Schrems et al.

(10) Patent No.: US 6,989,311 B2
(45) Date of Patent: Jan. 24, 2006

(54) METHOD FOR FABRICATING A TRENCH CONTACT TO A DEEP TRENCH CAPACITOR HAVING A POLYSILICON FILLING

(75) Inventors: Martin Schrems, Eggersdorf (AT); Dietmar Temmler, Dresden (DE); Andreas Wich-Glasen, Langebrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/147,544

(22) Filed: May 16, 2002

(65) Prior Publication Data

US 2002/0173110 A1 Nov. 21, 2002

(30) Foreign Application Priority Data

May 16, 2001 (DE) .......................... 101 23 770

(51) Int. Cl.
*H01L 21/20* (2006.01)

(52) U.S. Cl. .................. 438/388; 438/243; 438/245

(58) Field of Classification Search ............... 438/243, 438/386, 388, 245, 244, FOR 393, 246, 248, 438/391, 387, FOR 448, 239, 250, 253, 393, 438/396

See application file for complete search history.

(56) References Cited

U.S. PATENT DOCUMENTS

| | | | | |
|---|---|---|---|---|
| 5,365,097 A | * | 11/1994 | Kenney | 257/302 |
| 5,744,386 A | * | 4/1998 | Kenney | 438/245 |
| 5,843,820 A | * | 12/1998 | Lu | 438/243 |
| 6,171,961 B1 | * | 1/2001 | Yamazaki et al. | 438/688 |

* cited by examiner

*Primary Examiner*—George Fourson
*Assistant Examiner*—Julio Maldonado
(74) *Attorney, Agent, or Firm*—Laurence A. Greenberg; Werner H. Stemer; Ralph E. Locher

(57) ABSTRACT

The instant invention is a method for fabricating a trench contact to a deep trench capacitor with a polysilicon filling in a trench hole formed in a silicon substrate. An epitaxy process is performed to selectively grow silicon above the polysilicon filling in the trench hole. An opening leading to the polysilicon filling is anisotropically etched into the epitaxially grown silicon. The opening has lateral dimensions that are smaller than those of the polysilicon filling, and the opening is filled with polysilicon.

11 Claims, 5 Drawing Sheets

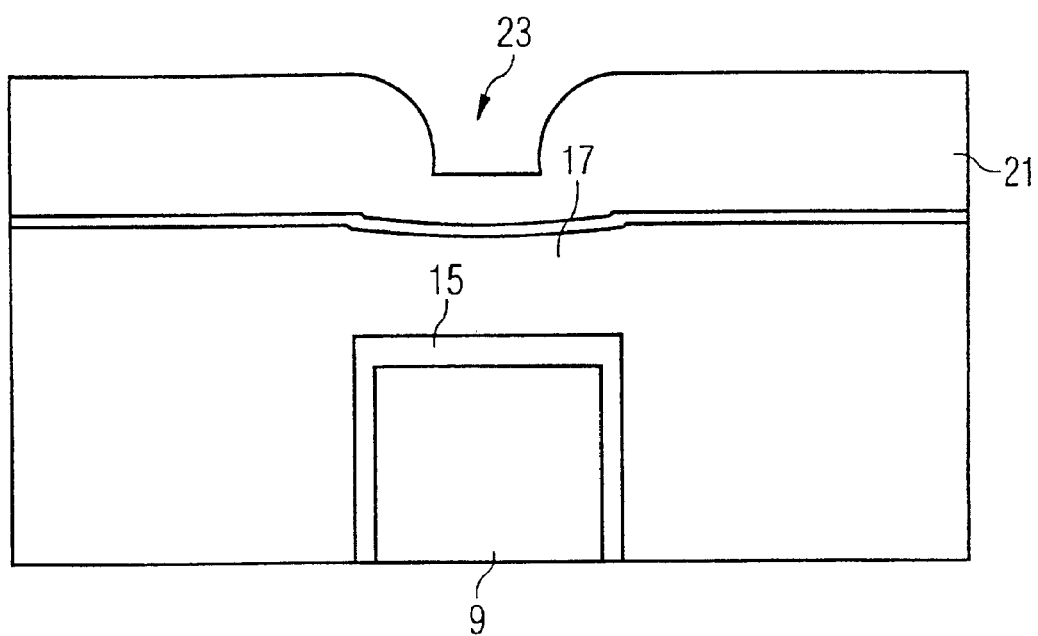
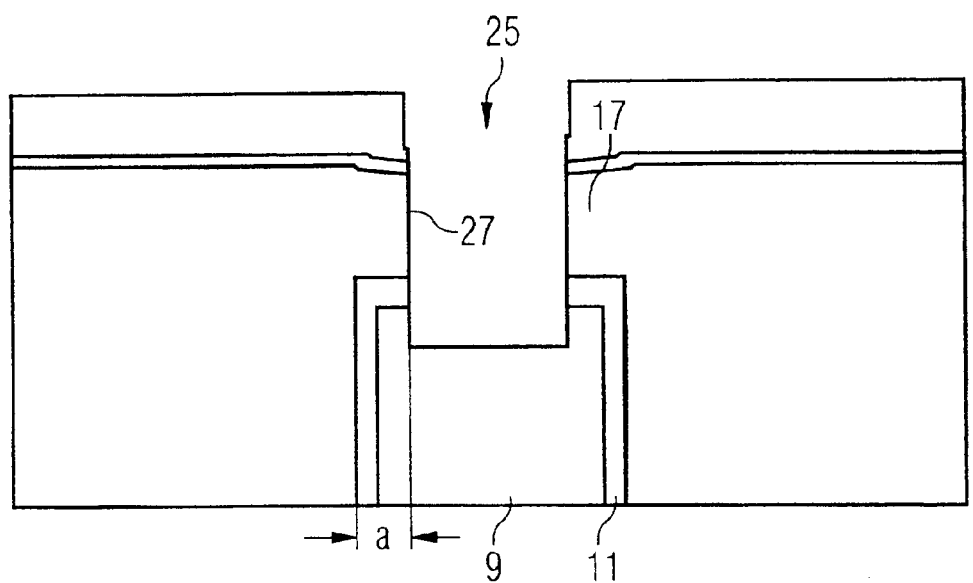

METHOD FOR FABRICATING A TRENCH CONTACT TO A DEEP TRENCH CAPACITOR HAVING A POLYSILICON FILLING

BACKGROUND OF THE INVENTION

Field of the Invention

The present invention relates to a method for fabricating a trench contact to a deep trench capacitor with a polysilicon filling in a trench hole formed in a silicon substrate. The method enables an increased distance between the trench contact and a transfer transistor to be obtained.

As the feature size of DRAM (Dynamic Random Access Memory) cells becomes increasingly small, ever higher demands are being imposed on the geometric conditions of the cell structures, on the technological procedure, in particular the overlay tolerances in lithography, and on the electrical performance of the transistors. In this context, in particular, parameters such as the width of the space charge zone, the outdiffusion of doping atoms and the doping concentration are becoming increasingly important. The known cell concept using a deep trench (DT) storage capacitor imposes very high demands on the points referred to above. According to the prior art, the technical embodiment is in this case based on fabricating a contact between the drain region of the selection transistor and the DT storage capacitor using a buried strap. The desired conductive connection is in this case fabricated using a dopant outdiffusion by controlling the thermal budget. The decreasing feature size means that the interface between the highly doped DT filling and the monocrystalline substrate is moving spatially ever closer to the region of diffusion beneath the selection transistor and therefore to the gate oxide of the latter. It is possible that the doping atoms which have diffused out of the DT may have a decisive influence on the diffusion beneath the transistor region, thus shortening the effective transistor channel length. This has an adverse effect on the switching behavior of the transistor. For example, it may be the case that the specified leakage currents can no longer be kept when the transistor is switched off, so that the holding time of the charge in the DT capacitor is considerably shortened. Furthermore, the transistor performance, such as for example, the roll off or the punch through, deteriorates. This in turn means that the size of process windows are disadvantageously reduced. The process window sizes are decisively influenced by the given lithographic overlay tolerances, especially that of the gate contact to DT level. The two important process parameters are therefore, the overlay tolerances and the thermal budget. Both parameters can only be optimized to a limited extent.

Prior art solutions consist in introducing tool dedication at the lithography levels. The lithography installation for the gate contact level and the DT level are selected to be identical, in order to increase the accuracy of the overlay, in making the specification limits for the overlay stricter, and in reducing the thermal budget throughout the entire procedure. These measures allow the above-described problem to be reduced, but the measures are in some cases complex, or on account of the resulting strictly limited doping profiles, lead to higher leakage currents at the corresponding pn junctions.

SUMMARY OF THE INVENTION

It is accordingly an object of the invention to provide a method in which the problems described above in connection with the short distance of the interface between the DT filling and the transistor are reduced.

With the foregoing and other objects in view there is provided, in accordance with the invention, a method for fabricating a trench contact to a deep trench capacitor with a polysilicon filling in a trench hole formed in a silicon substrate. The method includes steps of: performing an epitaxy process to selectively grow silicon above the polysilicon filling in the trench hole; anisotropically etching an opening in the epitaxially grown silicon such that the opening leads to the polysilicon filling and such that the opening has lateral dimensions that are smaller than those of the polysilicon filling; and filling the opening with polysilicon.

In accordance with an added feature of the invention, before performing the epitaxy process to selectively grow the silicon, an $SiO_2$ cap is produced on the polysilicon filling.

In accordance with an additional feature of the invention, the $SiO_2$ cap is produced by depositing a nonconformal $SiO_2$ layer and by performing a subsequent isotropic etching operation.

In accordance with another feature of the invention, the $SiO_2$ cap is produced with a thickness of approximately 20–40 nm.

In accordance with a further feature of the invention, before performing the step of anisotropically etching the opening, a conformal layer is deposited to make the subsequent etching self-aligning.

In accordance with a further added feature of the invention, the conformal layer is provided with a thickness of approximately 30–50 nm.

In accordance with a further additional feature of the invention, before performing the step of filling the opening with the polysilicon, an interface layer is produced on the walls of the opening.

In accordance with yet an added feature of the invention, the interface layer is provided with $Si_3N_4$.

In accordance with yet an additional feature of the invention, before performing the step of filling the opening, an implantation step is performed in the opening.

In accordance with yet another feature of the invention, before performing the epitaxy process to selectively grow the silicon, an $SiO_2$ cap is produced on the polysilicon filling; the epitaxy process is subsequently performed to selectively grow the silicon above the $SiO_2$ cap; and after performing the epitaxy process to selectively grow the silicon above the $SiO_2$ cap, an $H_2$ reflow process is performed.

The advantage of the invention consists in the fact that, as a result of a changed procedure, the interface and therefore the source of the doping atoms that diffuse out is moved well away from the transistor region. This relaxes the critical parameters for the electrical functionality of the transistor.

The invention solves the problem by the fact that monocrystalline silicon is grown completely over the DT polysilicon filling, which is preferably covered with a layer of oxide, as a result of selective epitaxy. The laterally shifted strap connection or the trench contact is fabricated by subsequent etching, which if appropriate, makes a self-aligning strap connection possible. Advantages of the invention include the following:

The strap region, from which atoms diffuse, is moved back, and therefore its effect on the transistor performance is reduced. The topology conditions for the STI (shallow trench isolation) processing (no or reduced recess 3) are improved. Dishing effects in STI CMP (shallow trench isolation, chemical mechanical polishing) are reduced, since there are longer AA ridges with pad nitride. In general the conditions of many technical processes, such as lithography and furnace processes, are relaxed.

According to the invention, it is possible to increase the distance by at least 10 nm without problems. Even such a small lateral offset of the trench contact leads to a measurable improvement in the transistor performance with a problem-free procedure. However, depending on the given geometric conditions of the semiconductor structure, it is even possible to establish an offset of up to 60 nm.

It is advantageous for an $SiO_2$ cap to be produced on the deep trench polysilicon prior to the selective growth of the Si. The use of the oxide cap decouples the monocrystalline silicon and the DT polysilicon, with the result that dislocations can be avoided. The thickness of the $SiO_2$ cap on the deep trench polysilicon is advantageously approximately 10–50 nm, in particular 20–40 nm. First of all, this ensures that the separating $SiO_2$ layer formed by the cap is thick enough to avoid a punch-through and to avoid dislocations resulting from the DT polysilicon coming into contact with the epitaxially grown, monocrystalline Si. On the other hand, the $SiO_2$ layer is also thin enough to be able to reliably control the process technology involved in the subsequent selective etching operation during the production of the recess trench.

According to a preferred embodiment, an $H_2$ reflow process is carried out after the selective growth of Si by epitaxy. This is in order to close up any voids and to better level the grown layer, or if appropriate, to flatten down any steep steps that have formed.

Other features which are considered as characteristic for the invention are set forth in the appended claims.

Although the invention is illustrated and described herein as embodied in a method for fabricating a trench contact to a deep trench capacitor having a polysilicon filling, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 shows the memory cell with a conformal s elf-aligning layer;

FIG. 6 shows the memory cell with an etched recess trench;

DESCRIPTION OF THE PREFERRED EMBODIMENTS

Figure 1:
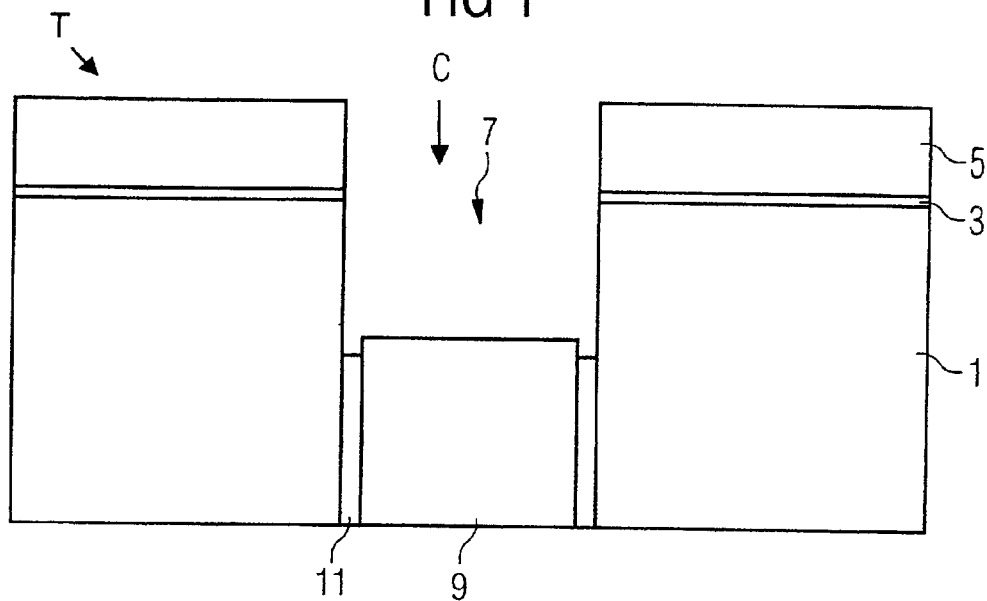
FIG. 1 is a sectional illustration of parts of a memory cell with a DT capacitor after forming a recess.

Referring now to the figures of the drawing in detail and first, particularly, to FIG. 1 thereof, there is shown a part of a DRAM memory cell, which is known per se, of a semiconductor circuit arranged on a wafer. The semiconductor circuit arrangement has undergone all of the method steps that precede the beginning of the steps of the inventive method disclosed herein (Widmann, Mader, Friedrich: Technologie hochintegrierter Schaltungen [Technology of large-scale integrated circuits]; 2nd edition, Springer-Verlag, p. 338; step 9: Recess 2). For the sake of simplicity, FIG. 1 and the subsequent figures only show part of the deep trench (DT) capacitor (C) and the immediately adjoining region of an associated transfer or selection transistor (T). A thin pad $Si_3N_4$ film 3 is provided on an Si substrate 1, followed by a $SiO_2$ pad layer 5. A trench 7 which is in the form of a blind bore and which is known per se is etched in the Si substrate 1. In the trench 7, there is a filling polysilicon or DT polysilicon 9 serving as a polysilicon core, which is surrounded by a collar oxide 11. The collar oxide 11 has been set back somewhat from the topside of the polysilicon 9 by performing a wet-chemical isotropic etching operation (FIG. 1).

Figure 2:
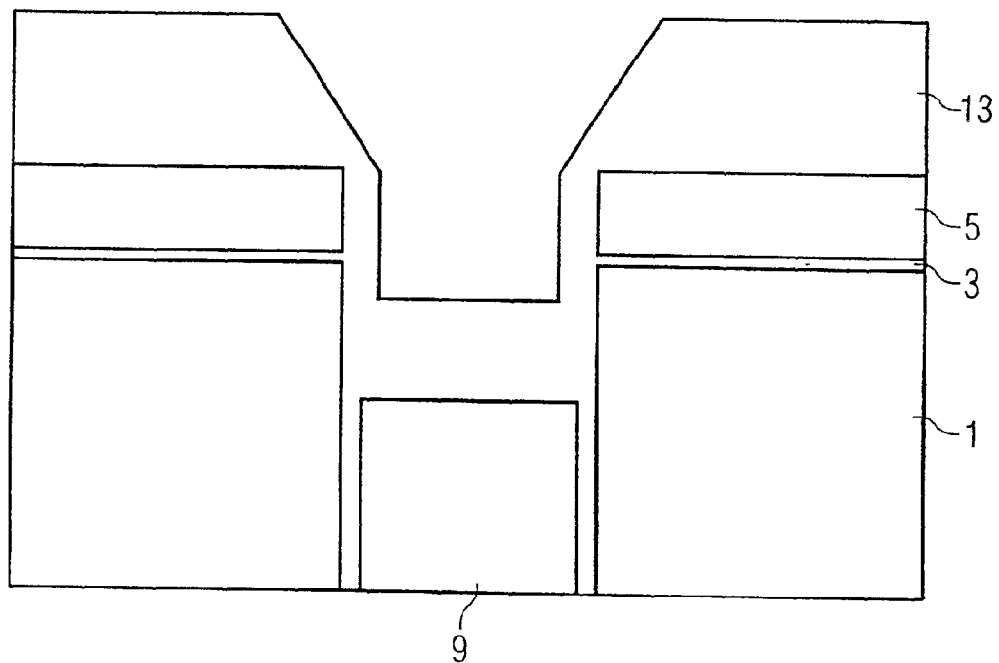
FIG. 2 shows the memory cell with a nonconformal oxide layer.
Figure 3:
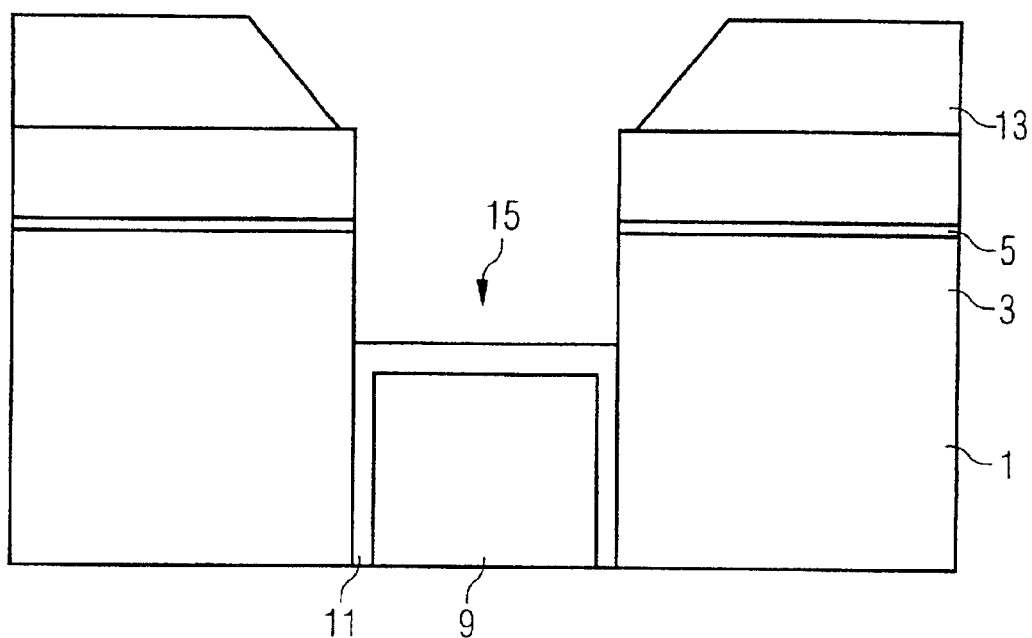
FIG. 3 shows the memory cell with an oxide cap.

The two subsequent process steps are used to produce an oxide cap 15 above the deep trench polysilicon 9 of the trench 7 (FIGS. 2, 3). This is typically achieved by HDP (high density plasma) oxide deposition. This type of deposition has the desired advantage that considerably less oxide can be deposited in a vertical plane than on horizontal planes (FIG. 2). It is therefore possible to subsequently employ an isotropic oxide etching process (RIE (reactive ion etching) or wet etching), so that the thinner oxide layer is completely removed from the side walls of the trench 7, yet the oxide cap 15 is retained with a sufficient thickness above the filling polysilicon 9 (FIG. 3). The thickness of the oxide cap 15 is typically about 20–40 nm. The object of this oxide cap 15 is to spatially separate the polysilicon 9 of the trench 7 from the monocrystalline silicon 17 which subsequently grows over it. This is necessary in order to avoid the disadvantageous formation of dislocations and mechanical stresses during subsequent thermal processes that are required. This method of producing the oxide cap 15 leads to particularly low levels of stress and is especially simple in terms of process technology.

Figure 4:
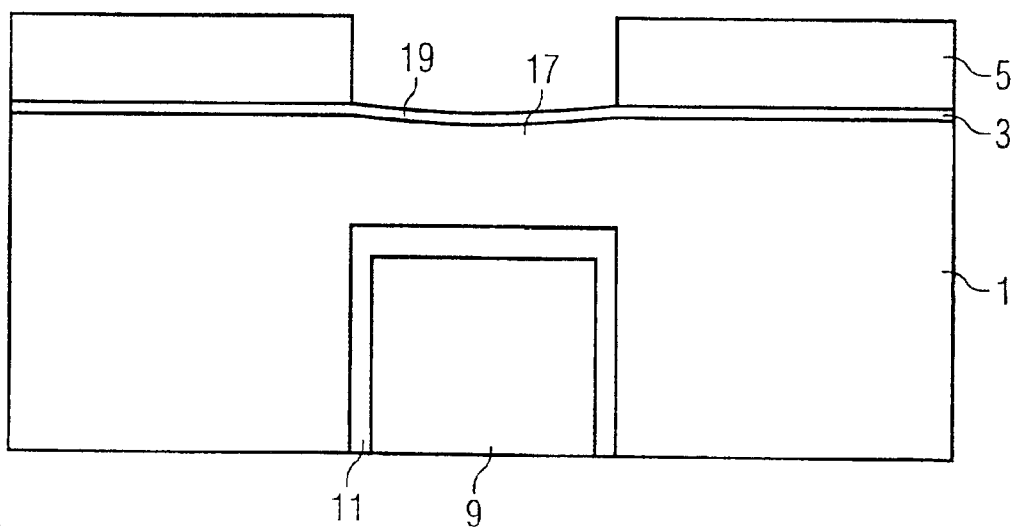
FIG. 4 shows the memory cell with epitaxially grown Si.

After the oxide cap 15 has been fabricated, monocrystalline Si 17 is grown over it with CVD (Chemical Vapor Deposition) technology using selective epitaxy in the subsequent method step shown in FIG. 4. The growth fronts begin from the monocrystalline silicon surface 1 which is laterally uncovered above the oxide cap 15 at the side walls of the trench 7 (FIG. 4) This growth typically takes place in such a way that the surface of the grown layer is at the same height as or slightly below the original silicon wafer surface. Then, a known $H_2$ reflow process is carried out in order to improve the structure properties, and a thin $SiO_2$ layer 19 is produced on the Si 17. Moreover, as shown in FIG. 4, the $SiO_2$ layer 13 is optionally removed on the thin pad $Si_3N_4$ layer 3.

Then, in the next process step shown in FIG. 5, a conformal layer is deposited on the structure, for example, as a conformal $Si_3N_4$ layer 21 that is easy to control in terms of process technology (FIG. 5). The result is a spacer 23 in the opening window of the pad $SiO_2$ layer 5. This process step makes it possible for the epitaxially increased distance between a trench contact 35 or buried strap in the form of the deep trench polysilicon 9 and the selection transistor (T) subsequently to be set at a suitable level, as is shown in more detail in FIG. 10. The thickness of this layer 21 is approximately 30–50 nm, in order, after the further process steps, to achieve in the finished state a lateral increase in distance a of approx. 20–40 nm, as described below (FIG. 6). At the same time, the deposition of the conformal $Si_3N_4$ layer 21 allows a self-aligning strap contact etching without requiring complex aligning of masks in the subsequent process step. To achieve improved bonding and therefore stress-reduced contact of the layer 21 to the silicon surface, oxidation can be carried out prior to the deposition of the $Si_3N_4$ layer 21.

In accordance with FIG. 5, the spacer 23 which has been produced in this way is used as an etching mask in order, in the subsequent method step shown in FIG. 6, to open up the $Si_3N_4$ layer 21 above the trench 7, the epitaxially grown silicon 17 and the oxide cap 15. This is done by anisotropic etching in a self-aligning manner by performing RIE etching (FIG. 6). The lateral dimension of the opening formed or of the recess trench 25 is in this case determined by the thickness of the laterally deposited $Si_3N_4$ layer. In this way, the polysilicon filling 9 of the trench 7 is uncovered again. The side wall of the recess trench 25 is arranged set back laterally by a distance "a" with respect to that of the trench 7 (FIG. 6). Then, thermal oxidation is optionally carried out, resulting in the production of an oxide layer with a typical thickness of 2–5 nm (not shown). In the process, the silicon 17 which has been uncovered in the recess trench 25 is laterally oxidized; the interface between the $SiO_2$ cap 15 and the epitaxially grown silicon 17 is also oxidized. This reduces interface states which are present and therefore potential leakage current mechanisms. After the oxidation, the laterally grown oxide layer is removed by wet-chemical processes, in order to uncover the surface of the silicon 17 again. This results in the starting situation for the subsequent interface fabrication. In this case, a thermally stable $Si_3N_4$ interface layer 27 that is typically up to 1 nm thick is produced. Alternatively, the interface may also be a conductive interface, for example consisting of tungsten nitride or titanium nitride, or a non-conductive interface, for example, consisting of $SiO_2$ (FIG. 6).

Moreover, it is optionally possible to carry out phosphorus or arsenic implantation (arrows) in the buried strap region, in order to improve the electrical behavior of the memory cell by in particular reducing the contact resistances. Depending on the process technology conditions, the implantation may be oblique (FIG. 7) or straight (not shown).

Figure 7:
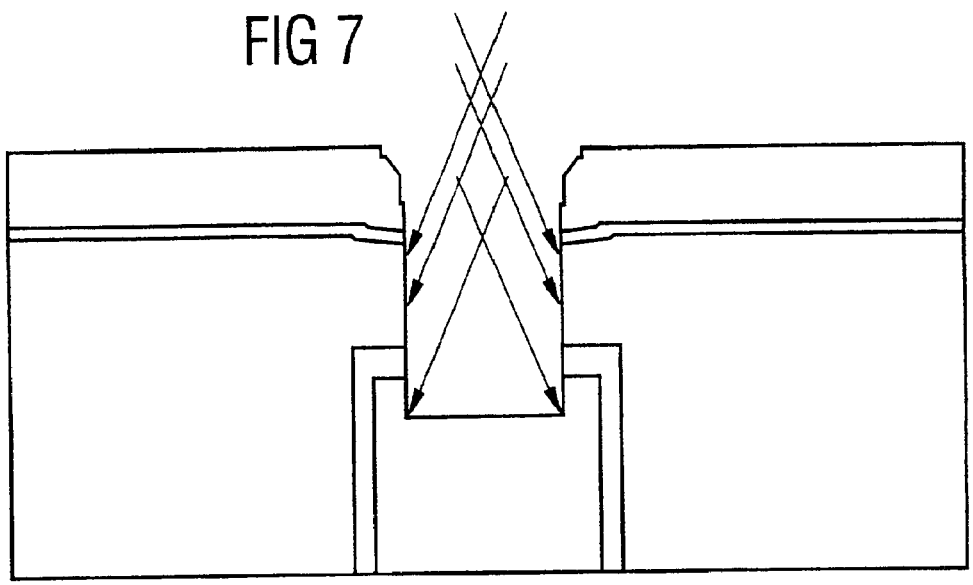
FIG. 7 shows the memory cell with a buried strap implantation.
Figure 8:
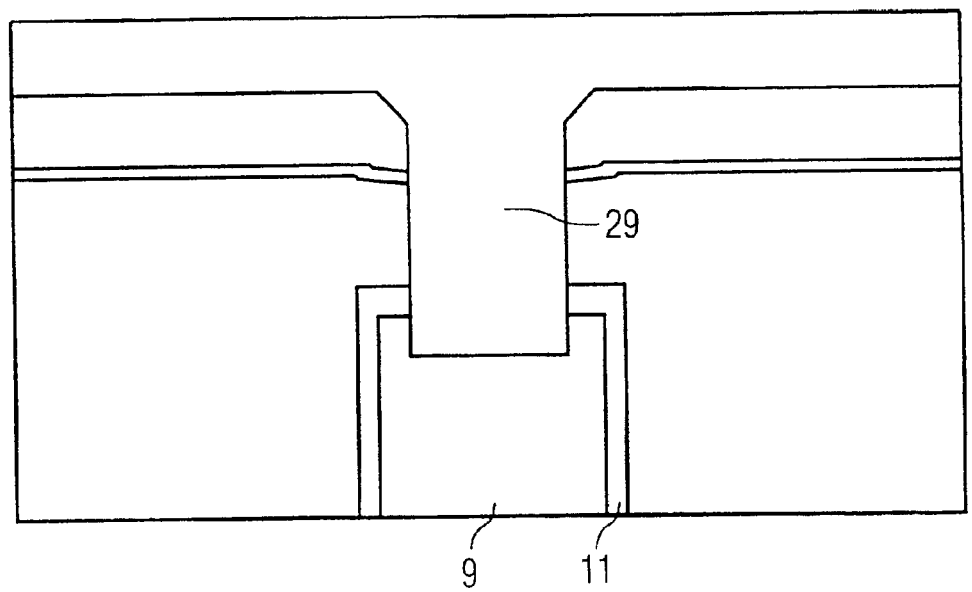
FIG. 8 shows the memory cell with polysilicon filling in the recess trench.

After fabricating the interface in accordance with FIGS. 6 and 7, the recess trench 25 and therefore the strap or trench contact 35 are filled by performing a CVD deposition of optionally doped polysilicon 29 (FIG. 8).

Figure 9:
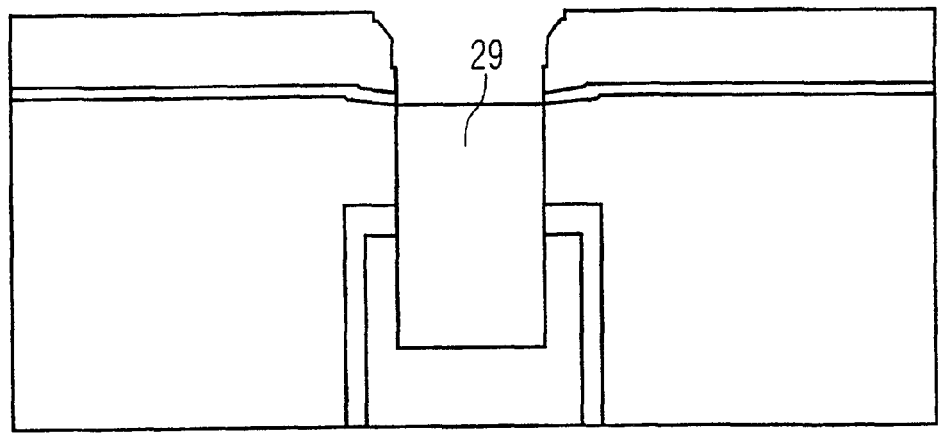
FIG. 9 shows the memory cell with an etched-back polysilicon filling.

The next method step involves RIE etching, as is used in the conventional process sequence (Widmann, Mader, Friedrich: Technologie hochintegrierter Schaltungen [Technology of large-scale integrated circuits]; 2nd edition, Springer-Verlag p. 339; step 11: recess 3), in order to etch back the polysilicon filling 29 (FIG. 9). This creates the starting situation for the subsequent STI (shallow trench isolation) process (FIG. 9), with FIG. 10 diagrammatically illustrating an STI module 31.

Figure 10:
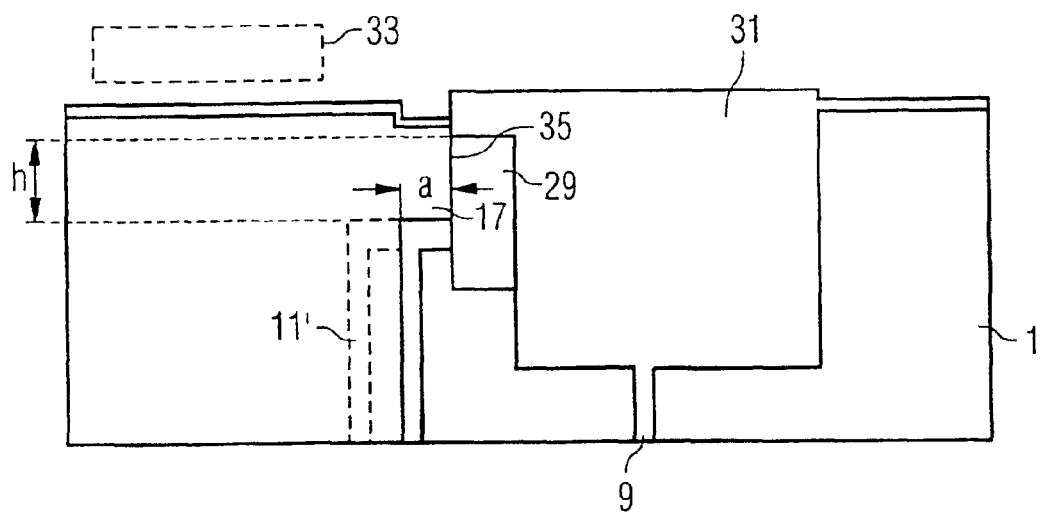
FIG. 10 shows the memory cell with an STI module.

FIG. 10 shows the DRAM semiconductor structure according to the invention, with the recess trench 25 and therefore the polysilicon filling 29 or the trench contact 35 being arranged set back laterally by the distance "a" compared to the trench 7 or the DT polysilicon 9, and therefore also from a highly diagrammatically illustrated transistor gate 33. This region is filled by the epitaxially grown Si 17. According to the invention, it is also possible to set a height h of the buried strap to standard size or smaller, in order to specifically improve the transistor performance. It is also possible in principle for the trench 7 to be originally enlarged laterally, since Si is epitaxially grown over the deep trench 7 in a subsequent method step, as described above. This advantageously enables the capacitance of the DT capacitor C to be increased. This is illustrated in simplified form in FIG. 10 by the displaced arrangement of the collar oxide 11'.

To summarize, therefore, the starting point or the source, in this case, the interface in the buried strap region, of the diffusion of the doping atoms out of the trench region is laterally shifted by the distance "a" as a result of the application of the selective epitaxy of monocrystalline Si in combination with a subsequent self-aligning strap contact etching. This means that the doping profile is set back with respect to the transistor region or the transistor gate 33.

We claim:
1. A method for fabricating a trench contact to a deep trench capacitor with a polysilicon filling in a trench hole formed in a silicon substrate, which comprises:
  providing the polysilicon filling in the trench hole formed in the silicon substrate causing the polysilicon filling to be set back from the top side of the silicon substrate;
  performing an epitaxy process to selectively grow silicon above the polysilicon filling in the trench hole causing the surface of the epitaxially grown silicon layer to be at the same height as or slightly below the top side of the silicon substrate;
  anisotropically etching an opening in the epitaxially grown silicon layer such that the opening leads to the polysilicon filling and such that the opening has lateral dimensions smaller than those of the polysilicon filling; and
  filling the opening with polysilicon to provide the trench contact to the deep trench capacitor.
2. The method according to claim 1, which comprises: before performing the epitaxy process to selectively grow the silicon, producing an $SiO_2$ cap on the polysilicon filling.
3. The method according to claim 2, which comprises: producing the $SiO_2$ cap by depositing a nonconformal $SiO_2$ layer and by performing a subsequent isotropic etching operation.
4. The method according to claim 3, which comprises: providing the $SiO_2$ cap with a thickness of approximately 20–40 nm.
5. The method according to claim 2, which comprises: providing the $SiO_2$ cap with a thickness of approximately 20–40 nm.
6. The method according to claim 1, which comprises: before performing the step of anisotropically etching the opening, depositing a conformal layer to make the etching self-aligning.
7. The method according to claim 6, which comprises: providing the conformal layer with a thickness of approximately 30–50 nm.
8. The method according to claim 1, which comprises: before performing the step of filling the opening with the polysilicon, producing an interface layer on walls of the opening.
9. The method according to claim 8, which comprises: providing the interface layer with $Si_3N_4$.

10. A method for fabricating a trench contact to a deep trench capacitor with a polysilicon filling in a trench hole formed in a silicon substrate, which comprises:

performing an epitaxy process to selectively grow silicon above the polysilicon filling in the trench hole;

anisotropically etching an opening in the epitaxially grown silicon layer such that the opening leads to the polysilicon filling and such that the opening has lateral dimensions smaller than those of the polysilicon filling;

filling the opening with polysilicon; and before performing the step of filling the opening, performing an implantation step in the opening.

11. The method according to claim 1, which comprises:

before performing the epitaxy process to selectively grow the silicon, producing an $SiO_2$ cap on the polysilicon filling;

performing the epitaxy process to selectively grow the silicon above the $SiO_2$ cap; and after performing the epitaxy process to selectively grow the silicon above the $SiO_2$ cap, performing an $H_2$ reflow process.

* * * * *